United States Patent
Jang et al.

(12)

(10) Patent No.: US 10,090,401 B2
(45) Date of Patent: Oct. 2, 2018

(54) THIN FILM TRANSISTOR, MANUFACTURING METHOD THEREOF, AND DISPLAY DEVICE INCLUDING THE SAME

(71) Applicant: SAMSUNG DISPLAY CO., LTD., Yongin-si, Gyeonggi-Do (KR)

(72) Inventors: Yongjae Jang, Seoul (KR); Waljun Kim, Hwaseong-si (KR); Joosun Yoon, Seoul (KR)

(73) Assignee: SAMSUNG DISPLAY CO., LTD., Yongin-Gyeonggi-Do (KR)

( * ) Notice: Subject to any disclaimer, the term of this patent is extended or adjusted under 35 U.S.C. 154(b) by 0 days.

(21) Appl. No.: 15/682,113

(22) Filed: Aug. 21, 2017

(65) Prior Publication Data
US 2018/0053836 A1    Feb. 22, 2018

(30) Foreign Application Priority Data
Aug. 22, 2016    (KR) .................. 10-2016-0106200

(51) Int. Cl.
| H01L 21/00 | (2006.01) |
| H01L 29/66 | (2006.01) |
| H01L 29/45 | (2006.01) |
| H01L 27/12 | (2006.01) |
| H01L 29/49 | (2006.01) |
| H01L 51/05 | (2006.01) |

(52) U.S. Cl.
CPC .... *H01L 29/66765* (2013.01); *H01L 27/1214* (2013.01); *H01L 29/458* (2013.01); *H01L 29/4908* (2013.01); *H01L 51/0512* (2013.01); *H01L 51/0545* (2013.01)

(58) Field of Classification Search
CPC combination set(s) only.
See application file for complete search history.

(56) References Cited

U.S. PATENT DOCUMENTS 9,196,737 B2    11/2015    Zhan
2005/0112807 A1    5/2005    Koo et al.

FOREIGN PATENT DOCUMENTS

| JP | 10233511 | 9/1998 |
| KR | 1020050050486 | 5/2005 |
| KR | 1020140087608 | 7/2014 |
| KR | 1020140102561 | 8/2014 |

*Primary Examiner* — Timor Karimy
(74) *Attorney, Agent, or Firm* — F. Chau & Associates, LLC

(57) ABSTRACT

A thin film transistor includes a substrate, a semiconductor layer, a first insulating layer, and a gate electrode. The gate electrode overlaps the semiconductor layer. The thin film transistor includes a second insulating layer on the gate electrode, and an electrode structure on the second insulating layer. The electrode structure is connected to the gate electrode through a via hole. The thin film transistor includes a source electrode and a drain electrode passing through the first insulating layer and the second insulating layer to be connected to the semiconductor layer. The semiconductor layer includes a channel area overlapping the gate electrode, a source area connected to the source electrode, a drain area connected to the drain electrode, a lightly doped source area, and a lightly doped drain area. The electrode structure overlaps at least one of the lightly doped source area or the lightly doped drain area.

15 Claims, 10 Drawing Sheets

THIN FILM TRANSISTOR, MANUFACTURING METHOD THEREOF, AND DISPLAY DEVICE INCLUDING THE SAME

CROSS-REFERENCE TO RELATED APPLICATION

This application claims priority under 35 USC § 119 to Korean Patent Application No. 10-2016-0106200, filed on Aug. 22, 2016, in the Korean Intellectual Property Office, the disclosure of which is incorporated by reference herein in its entirety.

TECHNICAL FIELD

Example embodiments of the present inventive concept relate to a thin film transistor, a method of manufacturing the thin film transistor, and a display device including the thin film transistor.

DISCUSSION OF THE RELATED ART

Display devices may include a liquid crystal display (LCD) device, an organic light emitting diode (OLED) display device, a plasma display panel (PDP) device, an electrophoretic display (EPD) device, and the like, based on a device structure and a light emitting scheme thereof.

A display device may include a gate line and a data line, and at least one thin film transistor (TFT) connected to the gate line and the data line. The TFT may be a switching element which applies a data voltage to a plurality of pixels in the display device.

With the trend toward display devices having higher degree of integration and higher performance, use of short-channel TFTs may be necessary. However, in case a channel length of the TFT is shortened, electron mobility may decrease due to hot carrier stress arising from a horizontal electric field, thus resulting in an increased off current.

SUMMARY

According to an exemplary embodiment of the present inventive concept, a thin film transistor includes a substrate, a semiconductor layer on the substrate, a first insulating layer on the semiconductor layer, and a gate electrode on the first insulating layer. The gate electrode overlaps the semiconductor layer. The thin film transistor further includes a second insulating layer on the gate electrode, and an electrode structure on the second insulating layer. The electrode structure is connected to the gate electrode through a via hole. The thin film transistor still further includes a source electrode and a drain electrode that pass through the first insulating layer and the second insulating layer that are connected to the semiconductor layer. The semiconductor layer includes a channel area overlapping the gate electrode, a source area connected to the source electrode, a drain area connected to the drain electrode, a lightly doped source (LDS) area formed between the source area and the channel area, and a lightly doped drain (LDD) area formed between the drain area and the channel area. The electrode structure overlaps at least one of the lightly doped source area or the lightly doped drain area.

According to an exemplary embodiment of the present inventive concept, a method of manufacturing a thin film transistor includes forming a semiconductor layer comprising a channel area, a source area, and a drain area, on a substrate. The method also includes forming a first insulating layer on the semiconductor layer, and forming a gate electrode on the first insulating layer. The method further includes doping a first concentration of n-type impurity using the gate electrode as a first mask, and forming a second insulating layer on the gate electrode. The method also includes defining a via hole in the second insulating layer. The gate electrode is exposed by the via hole. The method further includes forming an electrode structure on the second insulating layer. The electrode structure is connected to the gate electrode through the via hole. The method includes doping a second concentration of n-type impurity using the electrode structure as a second mask.

According to an exemplary embodiment of the present inventive concept, a display device includes a substrate, a semiconductor layer on the substrate, a first insulating layer on the semiconductor layer, and a gate electrode on the first insulating layer. The gate electrode overlaps the semiconductor layer. The display device further includes a second insulating layer on the gate electrode, and an electrode structure on the second insulating layer. The electrode structure is connected to the gate electrode through a via hole. The display device still further includes a source electrode and a drain electrode that pass through the first insulating layer and the second insulating layer that are connected to the semiconductor layer. The semiconductor layer includes: a channel area overlapping the gate electrode, a source area connected to the source electrode, a drain area connected to the drain electrode, a lightly doped source (LDS) area disposed between the source area and the channel area, and a lightly doped drain (LDD) area disposed between the drain area and the channel area. The electrode structure overlaps at least one of the lightly doped source (LDS) area or the lightly doped drain (LDD) area.

According to an exemplary embodiment of the present inventive concept, a method of manufacturing a thin film transistor includes forming a semiconductor layer comprising a channel area, a source area, and a drain area, on a substrate. The method also includes forming a first insulating layer on the semiconductor layer, and forming a gate electrode on the first insulating layer. The method further includes forming a photoresist on the gate electrode, and doping a first concentration of n-type impurity using one of the gate electrode or the photoresist as a first mask. The method further includes doping a second concentration of n-type impurity using the other of the gate electrode or the photoresist as a second mask. The method further includes forming a second insulating layer on the gate electrode, and defining a via hole in the second insulating layer. The gate electrode is exposed by the via hole. The method further includes forming an electrode structure on the second insulating layer. The electrode structure is connected to the gate electrode through the via hole.

BRIEF DESCRIPTION OF THE DRAWINGS

The above and other features of the inventive concept will become more apparent by describing in detail exemplary embodiments thereof, with reference to the accompanying drawings, which.

DETAILED DESCRIPTION OF THE EMBODIMENTS

Figure 1:
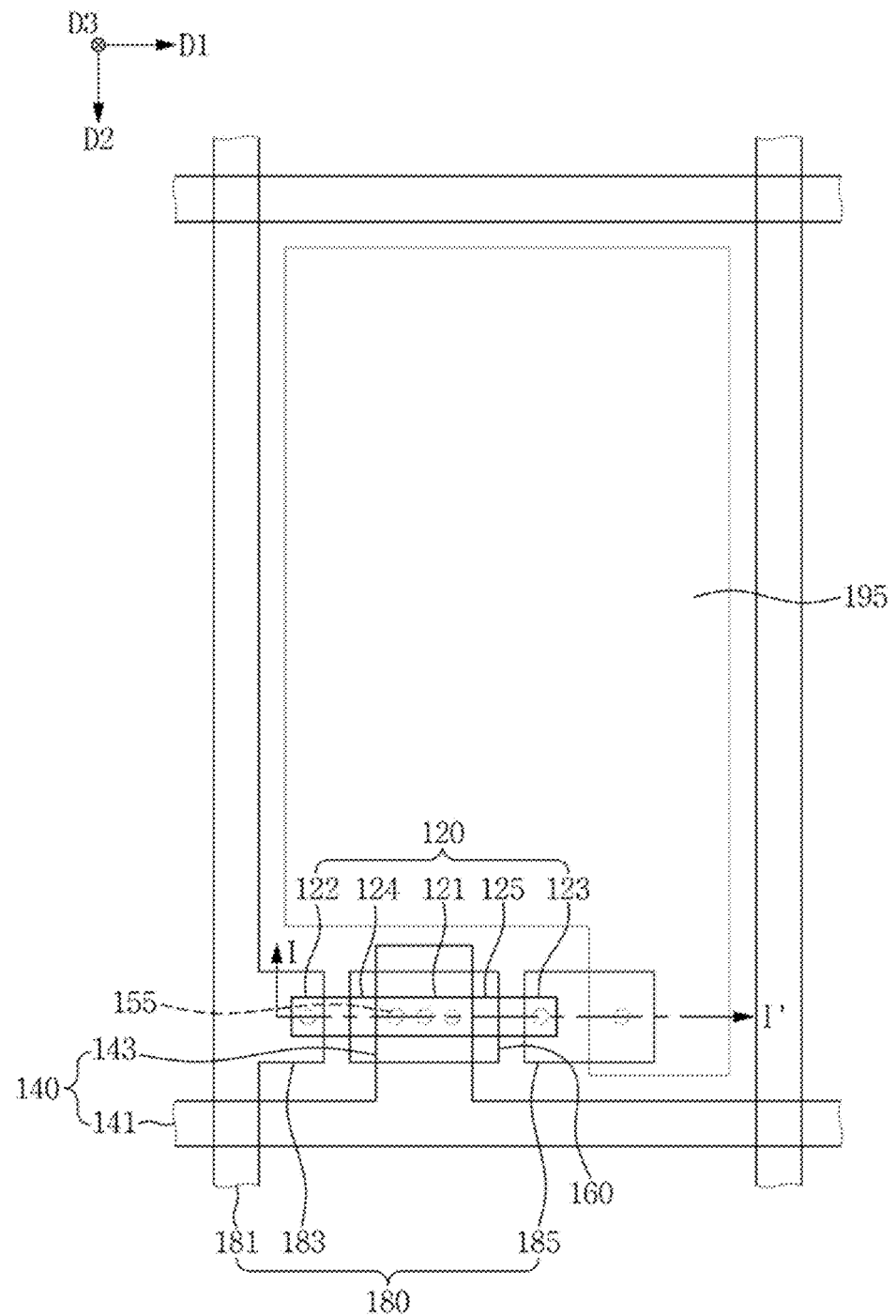
FIG. 1 is a schematic plan view of a display device according to an exemplary embodiment of the present inventive concept.

Exemplary embodiments of the present inventive concept will be described more fully hereinafter with reference to the accompanying drawings. The present disclosure may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the exemplary embodiments in order to prevent the invention from being obscurely interpreted. Like reference numerals refer to like elements throughout the specification.

It will be understood that when an element such as a layer, film, region, or substrate is referred to as being "on" another element, it can be directly on the other element or intervening elements may also be present. In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be abSE$_n$t therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be abSE$_n$t therebetween. The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently dePE$_n$ding on the orientations. Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the preSE$_n$ce of stated features, integers, steps, operations, elements, and/or components, but do not preclude the preSE$_n$ce or addition of one or more other features, integers, steps, operations, elements, components, and/or groups thereof. It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value. Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification. Some of the parts which are not associated with the description may not be provided in order to specifically describe embodiments of the present invention, and like reference numerals refer to like elements throughout the specification. Hereinbelow, an exemplary embodiment of a display device is described under the assumption that it is an organic light emitting diode ("OLED") display device. However, exemplary embodiments are not limited thereto, and an exemplary embodiment of a display device may be applied to a liquid crystal display ("LCD") device.

Figure 2:
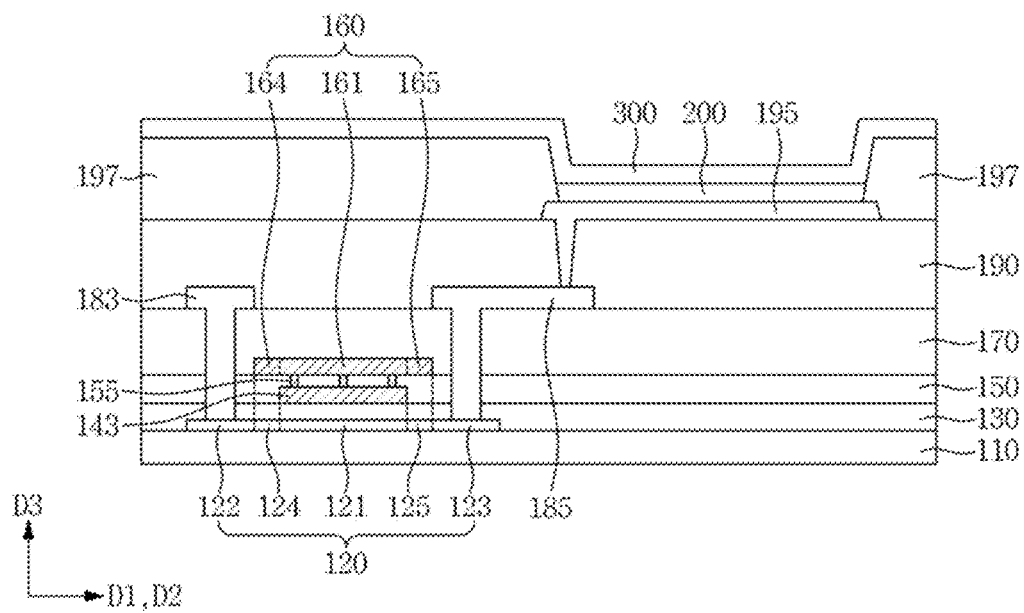
FIG. 2 is a cross-sectional view of the display device taken along line I-I' of FIG. 1 according to an exemplary embodiment of the present inventive concept.
Figure 3:
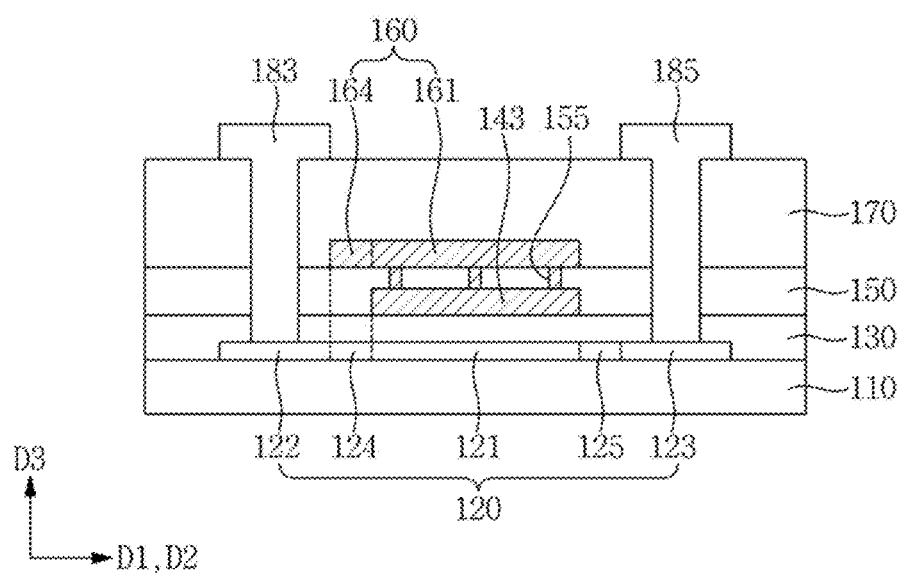
FIGS. 3, 4, and 5 are cross-sectional views of a thin film transistor according to one or more exemplary embodiments of the present inventive concept.
Figure 4:
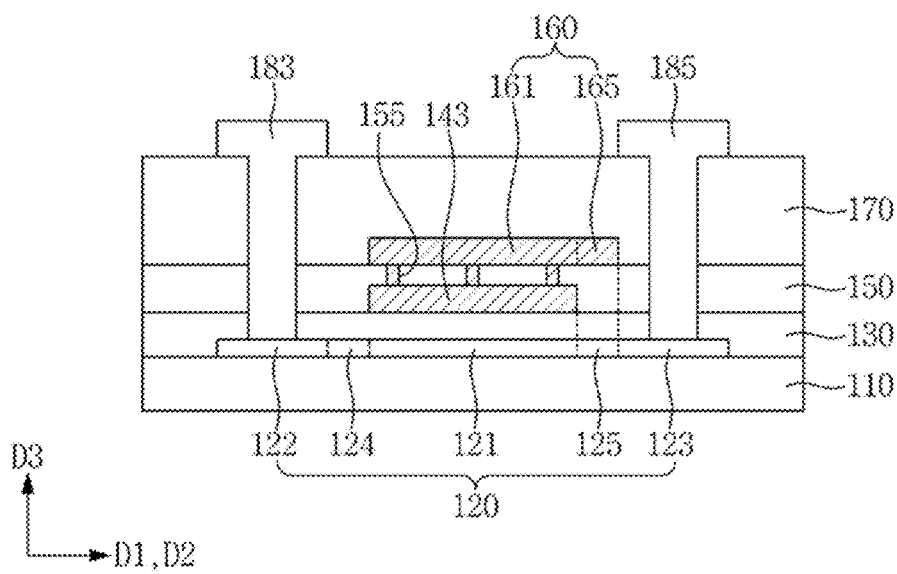
Figure 5:
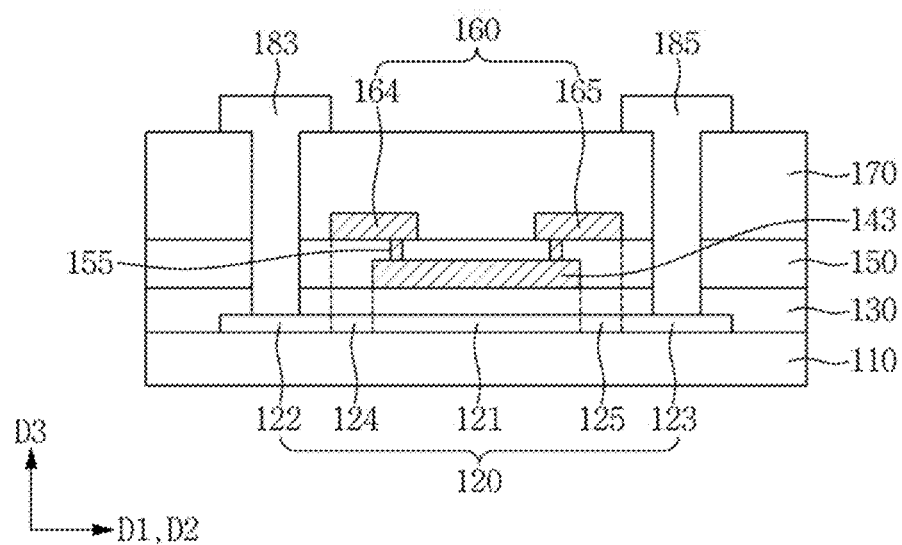

FIG. 1 is a schematic plan view of a display device according to an exemplary embodiment, FIG. 2 is a cross-sectional view of the display device taken along line I-I' of FIG. 1 according to an exemplary embodiment of the present inventive concept, and FIGS. 3, 4, and 5 are cross-sectional views of a thin film transistor according to one or more exemplary embodiments of the present inventive concept.

Referring to FIGS. 1 and 2, an exemplary embodiment of a display device may include a substrate 110, a semiconductor layer 120, a first insulating layer 130, a gate wiring 140, a second insulating layer 150, an electrode structure 160, a third insulating layer 170, a data wiring 180, a fourth insulating layer 190, a pixel electrode 195, a pixel defining layer 197, an organic light emitting layer 200, and a common electrode 300.

The substrate 110 may be an insulating substrate, e.g., a plastic substrate, which has light transmitting characteristics and flexibility. However, exemplary embodiments may not be limited thereto, and the substrate 110 may include a hard substrate such as a glass substrate. For example, the glass substrate may be thin enough to be flexible.

The semiconductor layer 120 may be disposed on the substrate 110. Although not illustrated, a buffer layer may be disposed between the substrate 110 and the semiconductor layer 120. The buffer layer may prevent or significantly reduce the impurities in the substrate 110 from permeating upwardly.

The semiconductor layer 120 may be a polycrystalline silicon obtained by crystallizing an amorphous silicon layer.

The semiconductor layer 120 may include a channel area 121, a source area 122, a drain area 123, a lightly doped source (LDS) area 124, and a lightly doped drain (LDD) area 125, for example.

The channel area 121 may be a portion of the semiconductor layer 120 overlapping a gate electrode 143, the source area 122 may be a portion of the semiconductor layer 120 connected to a source electrode 183, and the drain area 123 is a portion of the semiconductor layer 120 connected to a drain electrode 185. The channel area 121, the source area 122, and the drain area 123 may be described in detail below.

The LDS area 124 may be a portion of the semiconductor layer 120, and may be formed between the source area 122 and the channel area 121. The LDD area 125 may be a portion of the semiconductor layer 120, and may be formed between the channel area 121 and the drain area 123.

Each of the source area 122 and the drain area 123 may be an area doped with n-type impurities at a high concentration, and each of the LDS area 124 and the LDD area 125 may be an area doped with n-type impurities at a lower concentration than the concentration in the source area 122 and the drain area 123. The n-type impurity may include at least one selected from the group comprising: phosphorus (P) and arsenic (As). However, exemplary embodiments may not be limited thereto, and each of the source area 122 and the drain area 123 may be an area doped with p-type impurities at a high concentration, and each of the LDS area 124 and the LDD area 125 may be an area doped with p-type impurities at a lower concentration than the concentration in the source area 122 and the drain area 123. For example, the p-type impurity may include at least one selected from the group comprising: Boron (B) and Aluminium (Al).

Typically, a doping concentration of the source area 122 and the drain area 123 may be about $\sim 10^{15}/cm^3$, and a doping concentration of the LDS area 124 and the LDD area 125 may be about $\sim 10^{13}/cm^3$, where the doping concentration for the source area 122 and the drain area 123 may be higher than the doping concentration for the LDS area 124 and the LDD area 125. but exemplary embodiments may not be limited thereto.

In one example, the channel area 121 may not be doped with the n-type impurity, but in a manufacturing process, the channel area 121 may be doped with an n-type impurity at a lower concentration than the n-type impurity concentrations for the LDS area 124 and the LDD area 125.

The first insulating layer 130 may be disposed on the substrate 110 on which the semiconductor layer 120 may be disposed.

The first insulating layer 130 may include silicon oxide ($SiO_x$), silicon nitride ($SiN_x$), or the like. In addition, the first insulating layer 130 may further include aluminum oxide (AlxOy), titanium oxide (TiOx), tantalum oxide (TaxOy), zirconium oxide (ZrOx), or the like.

The gate wiring 140 may be disposed on the first insulating layer 130.

The gate wiring 140 may include a gate line 141 extending in a first direction D1. The gate electrode 143 may branch off from the gate line 141, and may extend in a different direction from the first direction D1. For example, the gate electrode 143 may extend in a second direction D2.

The gate electrode 143 may be disposed to overlap the channel area 121 of the semiconductor layer 120 as shown in FIG. 1 and FIG. 2.

The gate wiring 141 and 143 may include aluminum (Al) or alloys thereof, silver (Ag) or alloys thereof, copper (Cu) or alloys thereof, molybdenum (Mo) or alloys thereof, chromium (Cr), tantalum (Ta), titanium (Ti), and/or the like.

In addition, the gate wiring 140 may have a multilayer structure including two or more conductive layers (not illustrated) having different physical properties. For example, a first conductive layer of the multilayer structure may include a low resistivity metal, e.g., an aluminum (Al)-based metal, a silver (Ag)-based metal, and a copper (Cu)-based metal, to reduce a signal delay or a voltage drop, and a second conductive layer of the multilayer structure may include a material, e.g., a molybdenum (Mo)-based metal, chromium (Cr), titanium (Ti), or tantalum (Ta), which may impart excellent contact properties with indium tin oxide (ITO) and indium zinc oxide (IZO).

Exemplary examples of the multilayer structure may include a chromium (Cr) lower layer and the aluminum (Al) upper layer, the aluminum (Al) lower layer and the molybdenum (Mo) upper layer, and the titanium (Ti) lower layer and the copper (Cu) upper layer. However, exemplary embodiments may not be limited thereto, and the gate wiring 140 may include various kinds of metals and conductors. The gate wiring 140 may be simultaneously provided in the substantially same process, while, for example, the lower layer and the upper layer may be provided in the different processes.

As shown in FIG. 2, the second insulating layer 150 may be disposed on the substrate 110 on which the gate wiring 141 and 143 may be disposed. The second insulating layer 150 may include substantially the same material as that included in the first insulating layer 130.

The electrode structure 160 may be disposed on the second insulating layer 150.

The electrode structure 160 may pass through the second insulating layer 150 to be connected to the gate electrode 143. For example, the electrode structure 160 may be connected to the gate electrode 143 through a via hole 155 defined in the second insulating layer 150. FIGS. 1 and 2 may illustrate three via holes 155 that may connect the electrode structure 160 with the gate electrode 143. However, the number of the via holes 155 may not be limited thereto, and at least one via hole 155 may be defined in the second insulating layer 150.

Referring to FIG. 1, the electrode structure 160 may be depicted as having a quadrangular shape when viewed from the third direction D3, but exemplary embodiments may not be limited thereto. The electrode structure 160 may have various shapes, when viewed from the third direction D3, such as a triangular shape, a circular shape, and a polygonal shape. In addition, the electrode structure 160 may have an island shape when viewed from the third direction D3.

As shown in FIG. 2, an exemplary embodiment of the electrode structure 160 may include a first area 161 overlapping the gate electrode 143, a second area 164 overlapping the LDS area 124 of the semiconductor layer 120, and a third area 165 overlapping the LDD area 125 of the semiconductor layer 120.

However, exemplary embodiments may not be limited thereto. In one example, referring to FIG. 3, in an exemplary embodiment of the present inventive concept, the electrode structure 160 may include the first area 161 overlapping the gate electrode 143 and the second area 164 overlapping the LDS area 124 of the semiconductor layer 120.

In another example, referring to FIG. 4, an exemplary embodiment of the present inventive concept, the electrode structure 160 may include the first area 161 overlapping the gate electrode 143 and the third area 165 overlapping the LDD area 125 of the semiconductor layer 120.

In yet another example, referring to FIG. 5, an exemplary embodiment of the present inventive concept, the electrode structure 160 may include the second area 164 overlapping the LDS area 124 of the semiconductor layer 120 and the third area 165 overlapping the LDD area 125 of the semiconductor layer 120.

An exemplary embodiment of the electrode structure 160 may include substantially the same material as that included in the gate wiring 140.

As shown in, for example, FIGS. 3-5, the electrode structure 160 is connected to the gate electrode 143, and the voltage applied to the electrode structure 160 may be substantially the same voltage applied to the gate electrode 143.

The second area 164 of the electrode structure 160 may be disposed to overlap the LDS area 124 of the semiconductor layer 120, which may generate a vertical electric field. The vertical electric field may diminish an electric field generated between the gate electrode 143 and the LDS area 124, thus modifying element properties of the TFT.

Similarly, the third area 165 of the electrode structure 160 may be disposed to overlap the LDD area 125 of the semiconductor layer 120 to generate a vertical electric field. The vertical electric field may diminish an electric filed generated between the gate electrode 143 and the LDD area 125, thus modifying element properties of the TFT.

The third insulating layer 170 may be disposed on the second insulating layer 150 on which the electrode structure 160 may be disposed. The third insulating layer 170 may include substantially the same material as that included in the first insulating layer 130.

The data wiring 180 may be disposed on the third insulating layer 170.

The data wiring 180 may include a data line 181 extending in the second direction D2 (which intersects with the first direction D1), the source electrode 183 branching off from the data line 181, and the drain electrode 185 spaced apart from the source electrode 183.

The source electrode 183 may pass through the first insulating layer 130, the second insulating layer 150, and the third insulating layer 170 to be connected to the source area 122 of the semiconductor layer 120.

The drain electrode 185 may pass through the first insulating layer 130, the second insulating layer 150, and the third insulating layer 170 to be connected to the drain area 123 of the semiconductor layer 120.

The data wiring 180 may include substantially the same material as that included in the gate wiring 140. For example, data line 181, the source electrode 183, and the drain electrode 185 may include material that may be substantially the same as the gate line 141 and the gate electrode 143.

The fourth insulating layer 190 may be disposed on the third insulating layer 170 on which the data wiring 181, 183, and 185 is disposed. The fourth insulating layer 190 may include substantially the same material as that included in the first insulating layer 130.

The pixel electrode 195 may be disposed on the fourth insulating layer 190. The pixel electrode 195 may pass through the fourth insulating layer 190 to be connected to the drain electrode 185.

The pixel electrode 195 may include a transparent conductive material. For example, the pixel electrode 195 may include indium tin oxide (ITO), indium zinc oxide (IZO), indium tin zinc oxide (ITZO), and aluminum zinc oxide (AZO).

The pixel defining layer 197 may be disposed on the fourth insulating layer 190. In one example, the pixel defining layer 197 may be disposed at an edge portion of the pixel electrode 195 as shown in FIG. 2.

The pixel defining layer 197 may include a silica-based inorganic material and a resin such as a polyacrylate resin or a polyimide resin.

The organic light emitting layer 200 may be disposed on the pixel electrode 195 defined by the pixel defining layer 197. The organic light emitting layer 200 may include a multilayer structure including at least one of a hole injection layer (HIL), a hole transporting layer (HTL), an electron transporting layer (ETL), and an electron injection layer (EIL).

The common electrode 300 may be disposed on the organic light emitting layer 200 and the pixel defining layer 197. The common electrode 300 may include the transparent conductive material such as indium tin oxide (ITO), indium zinc oxide (IZO), indium tin zinc oxide (ITZO), and aluminum zinc oxide (AZO).

FIGS. 6A, 6B, 6C, 6D, 6E, and 6F are views illustrating a method of manufacturing a thin film transistor according to one or more exemplary embodiments of the present inventive concept.

Figure 6A:
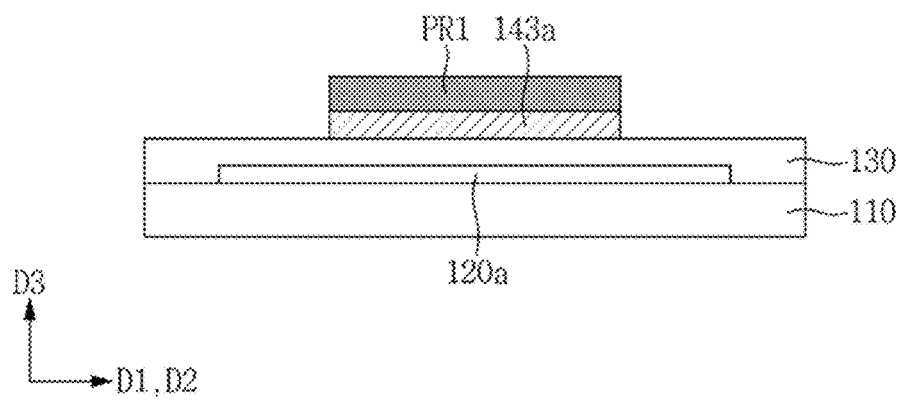
FIGS. 6A, 6B, 6C, 6D, 6E, and 6F illustrate a method of manufacturing a thin film transistor according to one or more exemplary embodiments of the present inventive concept.

Referring to FIG. 6A, a non-doped semiconductor layer 120a may be formed on the substrate 110.

Subsequently, the first insulating layer 130 may be disposed over the substrate 110 on which the non-doped semiconductor layer 120a is formed, a gate wiring forming material may be coated over the first insulating layer 130, and then a first etching prevention layer PR1 is formed thereon.

Subsequently, the gate wiring forming material may be wet-etched using the first etching prevention layer PR1 such that the gate line (not illustrated) and the gate electrode pattern 143a may be formed. The first etching prevention layer PR1 and the gate electrode pattern 143a may be disposed to overlap an area provided with the channel area and low doping concentration area, which may be described below.

Figure 6B:
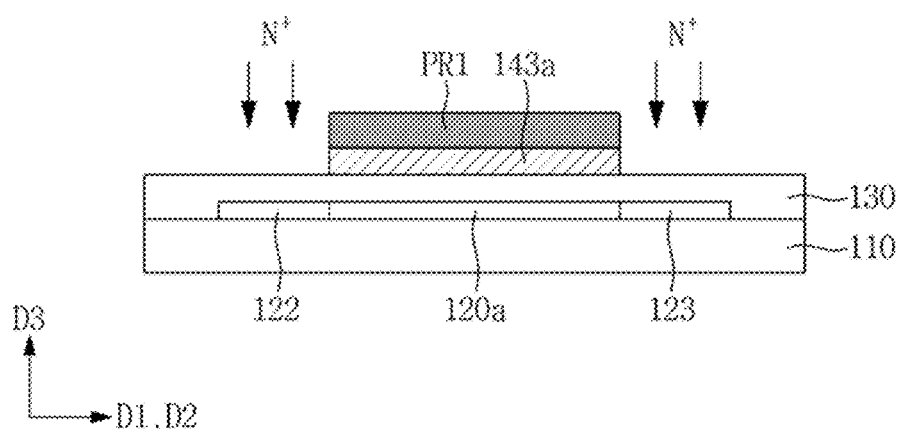

Referring to FIG. 6B, the high concentration of n-type impurity (N$^+$) may be provided using the first etching prevention layer PR1 and the gate electrode pattern 143a, formed hereinabove, as a mask. Accordingly, opposite end portions of the non-doped semiconductor layer 120a may receive the n-type impurity, and form the source area 122 and the drain area 123, respectively, which are doped with the high concentration of n-type impurities.

Figure 6C:
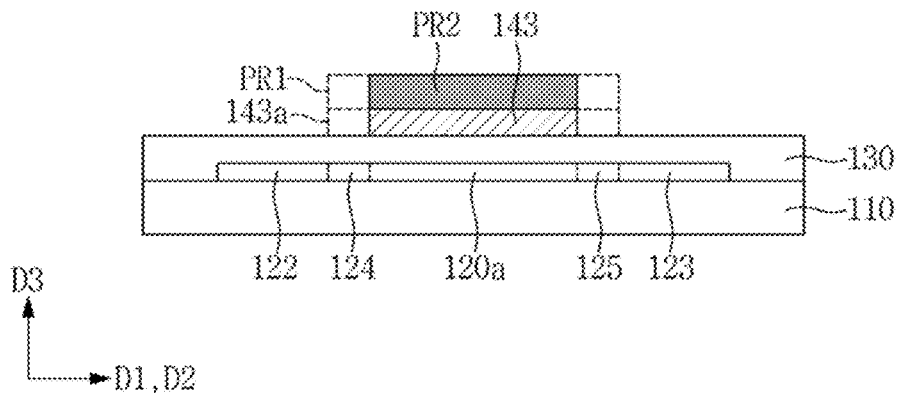

Referring to FIG. 6C, the first etching prevention layer PR1, formed hereinabove, may be ashed to form a second etching prevention layer PR2, and the gate electrode pattern 143a may be wet-etched using the second etching prevention layer PR2 such that the gate electrode 143 is formed. Accordingly, a portion of the non-doped semiconductor layer 120a may be further exposed to form the low doping concentration areas 124 and 125. The second etching prevention layer PR2 and the gate electrode 143 may be formed to overlap an area of the non-doped semiconductor layer 120a that may form the channel area, which may be described hereinbelow.

Figure 6D:
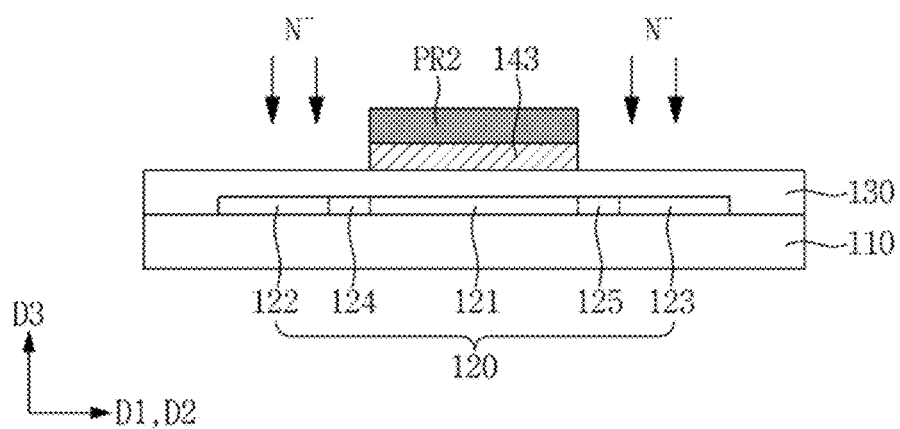

Referring to FIG. 6D, a low concentration of n-type impurity (N⁻) may be provided using the second etching prevention layer PR2 and the gate electrode 143, formed hereinabove, as the mask. In one example, the low concentration of n-type impurity (N⁻) may be less than the high concentration of n-type impurity described with reference to FIG. 6B. The non-doped semiconductor layer 120a may form the channel area 121, and the low doping concentration areas 124 and 125 may be formed between the channel area 121 and the source area 122, and between the channel area 121 and the drain area 123, respectively. The channel area 121, the source area 122, the drain area 123, and the low doping concentration areas 124 and 125 may be collectively referred to as the semiconductor layer 120. The low doping concentration areas 124 and 125 may include the LDS area 124 between the channel area 121 and the source area 122 and the LDD area 125 between the channel area 121 and the drain area 123.

Figure 6E:
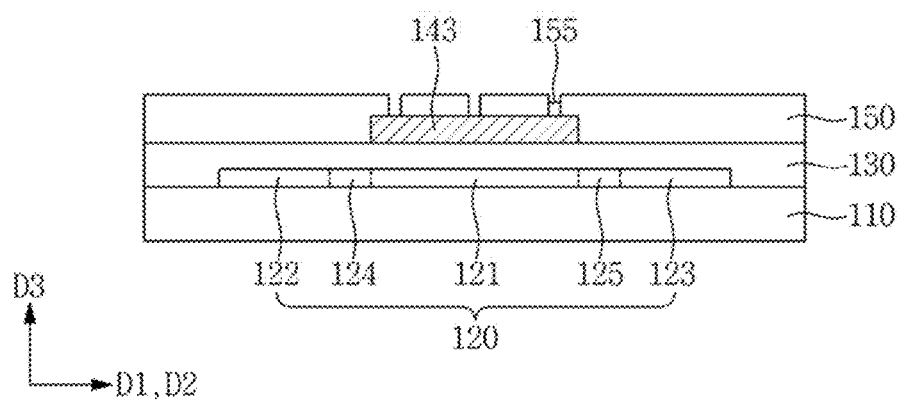

Referring to FIG. 6E, the second etching prevention layer PR2 may be removed, and the second insulating layer 150 may be formed on the first insulating layer 130 on which the gate electrode 143 is formed. Subsequently, the via hole 155 exposing a portion of the gate electrode 143 may be defined in the second insulating layer 150.

Figure 6F:
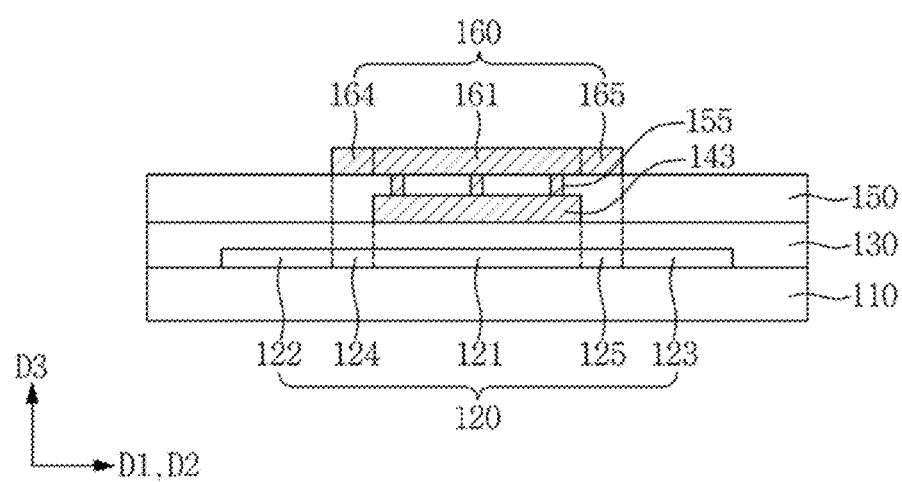

Referring to FIG. 6F, the electrode structure 160 may be formed on the second insulating layer 150, and may be connected to the gate electrode 143 through the via hole 155. The electrode structure 160 may be formed to overlap at least one of the low doping concentration areas 124 and 125 of the semiconductor layer 120 when viewed in the third direction D3. For example, the electrode structure 160 may include the first area 161 overlapping the gate electrode 143, the second area 164 overlapping the LDS area 124 of the semiconductor layer 120, and the third area 165 overlapping the LDD area 125 of the semiconductor layer 120.

FIGS. 7A, 7B, 7C, 7D, and 7E are views illustrating a method of manufacturing a thin film transistor according to one or more exemplary embodiments of the present inventive concept.

Figure 7A:
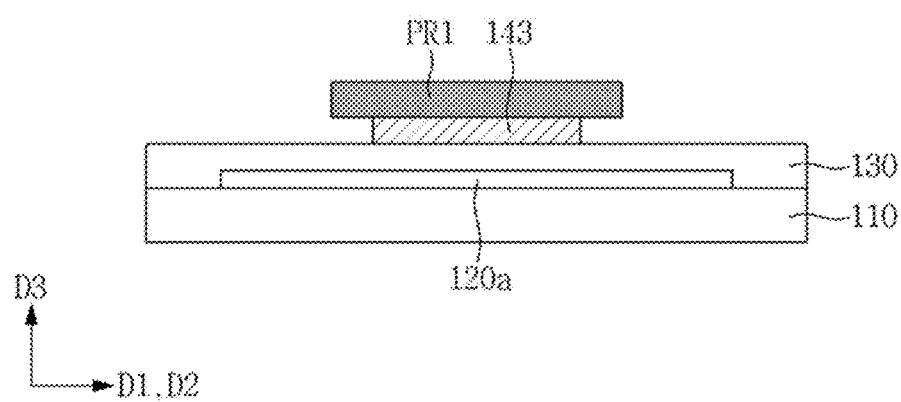
FIGS. 7A, 7B, 7C, 7D, and 7E illustrate a method of manufacturing a thin film transistor according to one or more exemplary embodiments of the present inventive concept.

Referring to FIG. 7A, the non-doped semiconductor layer 120a may be formed on the substrate 110.

Subsequently, the first insulating layer 130 may be formed over the substrate 110 on which the non-doped semiconductor layer 120a is formed, a gate wiring forming material may be coated over the first insulating layer 130, and then a first etching prevention layer PR1 is formed thereon.

The first etching prevention layer PR1 may be formed to overlap an area forming the channel area and the low doping concentration area. Subsequently, the gate wiring forming material may be wet-etched using the first etching prevention layer PR1. In such an exemplary embodiment, by virtue of characteristics of the wet-etching process employed, the gate electrode 143 may be formed to have a less width than that of the first etching prevention layer PR1.

Figure 7B:
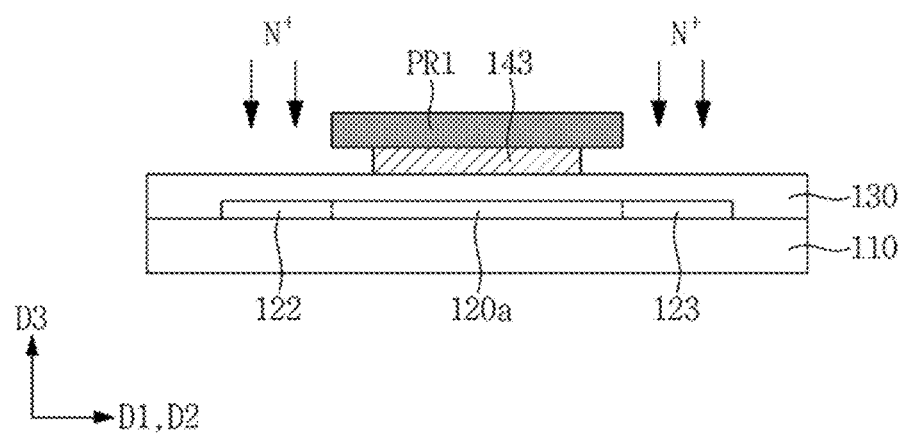

Referring to FIG. 7B, the high concentration of n-type impurity (N⁺) may be doped using the first etching prevention layer PR1 as the mask. Accordingly, opposite end portions of the non-doped semiconductor layer 120a may receive the low concentration of n-type impurity, and form the source area 122 and the drain area 123, respectively, which are doped with the high concentration of n-type impurities.

Figure 7C:
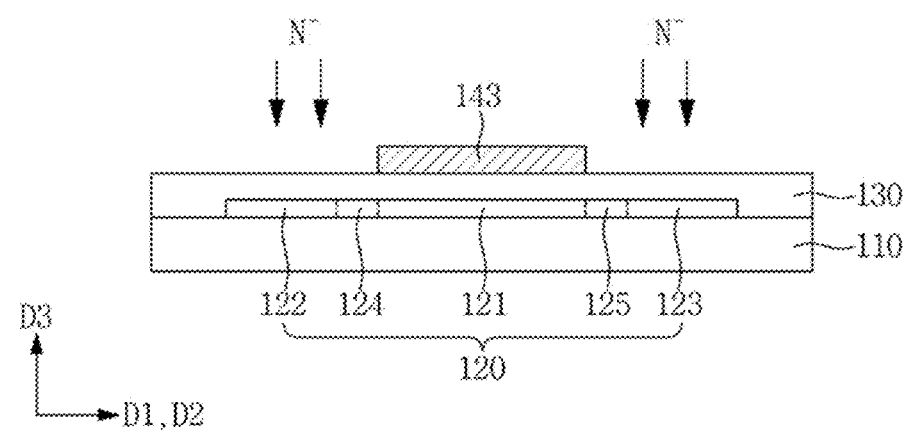

Referring to FIG. 7C, the first etching prevention layer PR1 may be removed, and the low concentration of n-type impurity (N⁻) may be doped using the gate electrode 143 as the mask. In one example, the low concentration of n-type impurity (N⁻) may be less than the high concentration of n-type impurity described with reference to FIG. 7B. The non-doped semiconductor layer 120a may form the channel area 121, and the low doping concentration areas 124 and 125 may be formed between the channel area 121 and the source area 122 and between the channel area 121 and the drain area 123, respectively. The channel area 121, the source area 122, the drain area 123, and the low doping concentration areas 124 and 125 may be collectively referred to as the semiconductor layer 120. The low doping concentration areas 124 and 125 may include an LDS area 124 between the channel area 121 and the source area 122, and an LDD area 125 between the channel area 121 and the drain area 123, respectively.

Figure 7D:
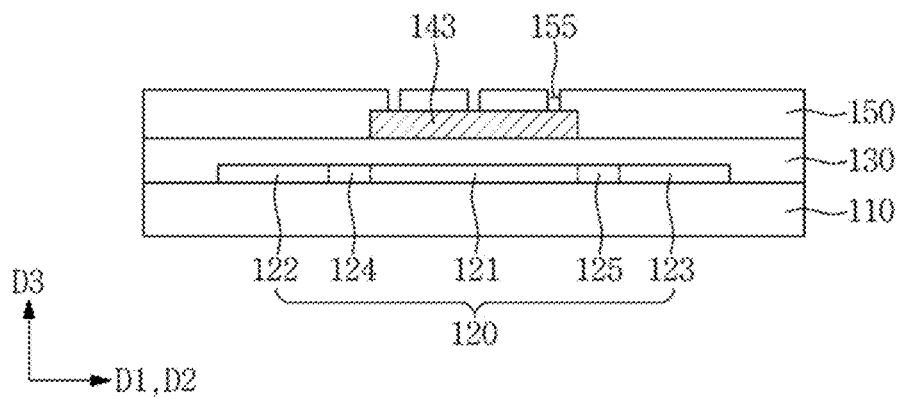

Referring to FIG. 7D, the second insulating layer 150 may be formed on the first insulating layer 150 on which the gate electrode 143 is formed. Subsequently, the via hole 155 exposing a portion of the gate electrode 143 is defined in the second insulating layer 150.

Figure 7E:
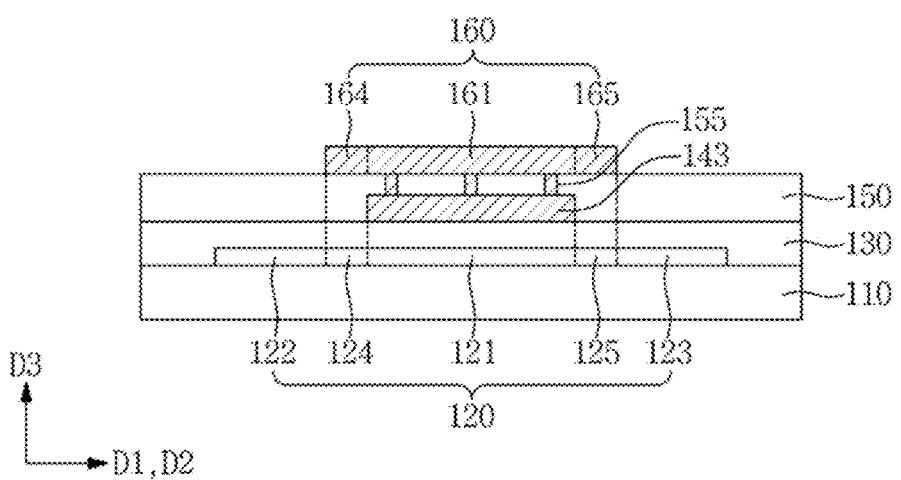

Referring to FIG. 7E, the electrode structure 160 connected to the gate electrode 143 through the via hole 155 may be formed on the second insulating layer 150. The electrode structure 160 may be formed to overlap at least one of the low doping concentration areas 124 and 125 of the semiconductor layer 120 when viewed in the third direction D3. For example, the electrode structure 160 may include the first area 161 overlapping the gate electrode 143, the second area 164 overlapping the LDS area 124 of the semiconductor layer 120, and the third area 165 overlapping the LDD area 125 of the semiconductor layer 120.

FIGS. 8A, 8B, 8C, and 8D are views illustrating a method of manufacturing a thin film transistor according to one or more exemplary embodiments of the present inventive concept.

Figure 8A:
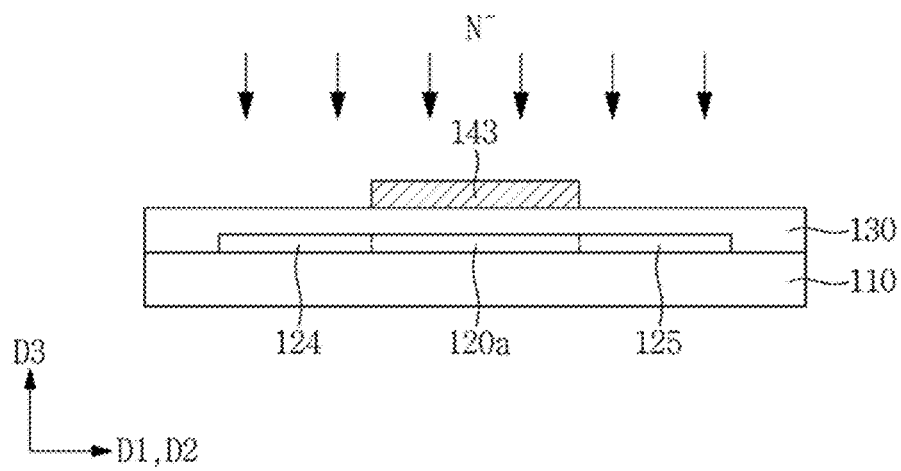
FIGS. 8A, 8B, 8C, and 8D illustrate a method of manufacturing a thin film transistor according to one or more exemplary embodiments of the present inventive concept.

Referring to FIG. 8A, the non-doped semiconductor layer 120a may be formed on the substrate 110.

Subsequently, the first insulating layer 130 may be formed over the substrate 110 on which the non-doped semiconductor layer 120a is formed, and a gate electrode 143 may be formed on the first insulating layer 130. The gate electrode 143 may be formed to overlap an area forming the channel area.

Subsequently, the low concentration of n-type impurity (N⁻) may be doped using the gate electrode 143 as the mask. Accordingly, opposite end portions of the non-doped semiconductor layer 120a may receive the low concentration of n-type impurity and form the low doping concentration areas 124 and 125, respectively, which are doped with the low concentration of n-type impurities.

Figure 8B:
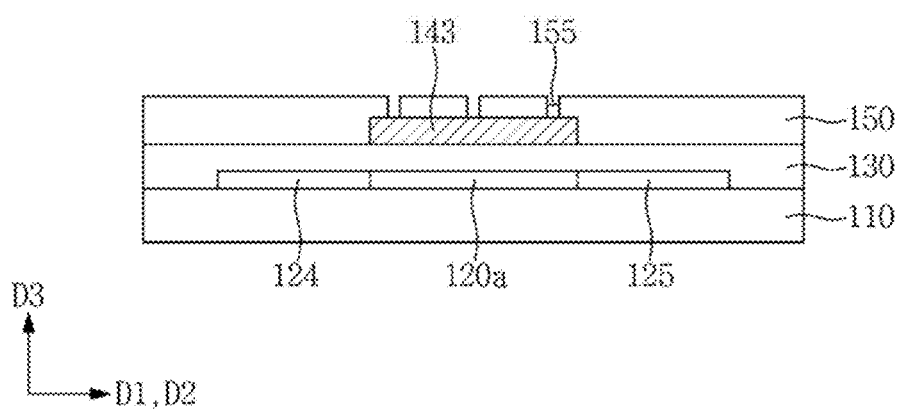

Referring to FIG. 8B, the second insulating layer 150 may be formed on the first insulating layer 130 on which the gate electrode 143 is formed. Subsequently, the via hole 155 exposing a portion of the gate electrode 143 is defined in the second insulating layer 150.

Figure 8C:
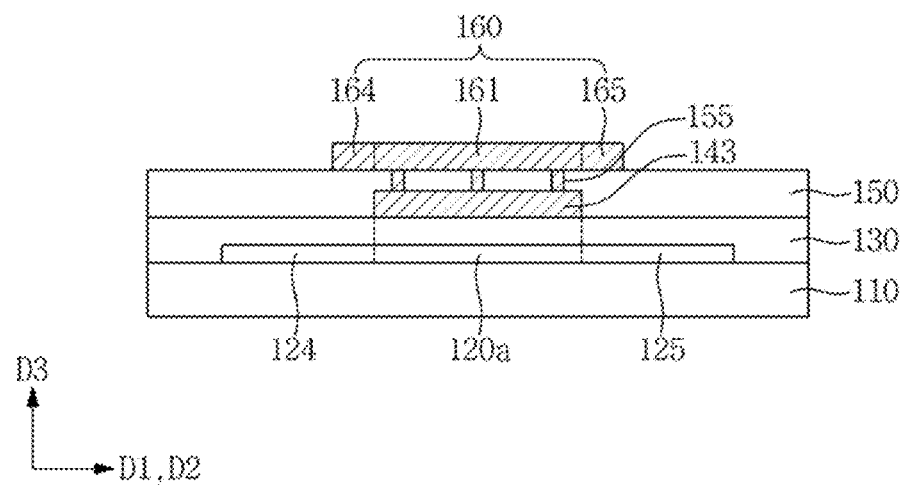

Referring to FIG. 8C, the electrode structure 160 connected to the gate electrode 143 through the via hole 155 may be formed on the second insulating layer 150. The electrode structure 160 may include the first area 161 overlapping the gate electrode 143, the second area 164 overlapping the LDS area 124 of the semiconductor layer 120, and the third area 165 overlapping the LDD area 125 of the semiconductor layer 120.

Figure 8D:
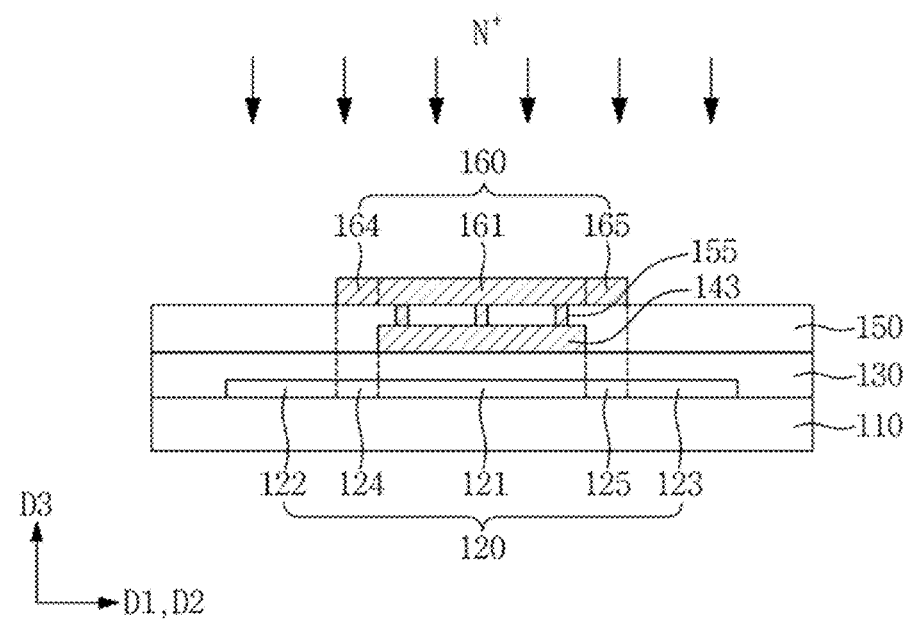

Referring to FIG. 8D, the high concentration of n-type impurity (N⁺) may be provided in the third direction D3 using the electrode structure 160 as the mask. Accordingly, the non-doped semiconductor layer 120a may form the channel area 121, and portions of the low doping concentration areas 124 and 125 not overlapping the electrode structure 160 may be provided with the high concentration of n-type impurities to form the source area 122 and the drain area 123.

As set forth hereinabove, in one or more exemplary embodiments, a TFT further includes the electrode structure that forms, along with the lightly doped area, a vertical electric field, thus adjusting an electric field in the lightly doped area, such that element properties of the TFT may be modified.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention as claimed herein.

What is claimed is:

1. A thin film transistor comprising:
   a substrate;
   a semiconductor layer on the substrate;
   a first insulating layer on the semiconductor layer;
   a gate electrode on the first insulating layer, the gate electrode overlapping the semiconductor layer;
   a second insulating layer on the gate electrode;
   an electrode structure on the second insulating layer, the electrode structure connected to the gate electrode through at least one via hole; and
   a source electrode and a drain electrode passing through the first insulating layer and the second insulating layer to be connected to the semiconductor layer,
   wherein the semiconductor layer comprises:
   a channel area overlapping the gate electrode;
   a source area connected to the source electrode;
   a drain area connected to the drain electrode;
   a lightly doped source (LDS) area between the source area and the channel area; and
   a lightly doped drain (LDD) area between the drain area and the channel area, and
   the electrode structure overlaps at least one of the lightly doped source (LDS) area or the lightly doped drain (LDD) area.

2. The thin film transistor as claimed in claim 1, wherein the electrode structure overlaps the lightly doped source area and the lightly doped drain area.

3. The thin film transistor as claimed in claim 1, wherein the gate electrode does not overlap the lightly doped source area and the lightly doped drain area.

4. The thin film transistor as claimed in claim 1, wherein a concentration of an n-type impurity of the lightly doped source area and the lightly doped drain area is lower than the concentration of the n-type impurity of the source area and the drain area.

5. The thin film transistor as claimed in claim 4, wherein the n-type impurity comprises at least one selected from a group comprising phosphorus (P) and arsenic (As),.

6. The thin film transistor as claimed in claim 1, wherein the gate electrode and the electrode structure are provided with substantially the same voltage.

7. The thin film transistor as claimed in claim 1, wherein a concentration of an n-type impurity of the channel area is lower than the concentrations of the n-type impurity of the lightly doped source area and the lightly doped drain area.

8. The thin film transistor as claimed in claim 1, wherein the electrode structure has an island shape from a direction perpendicular to a surface of the substrate.

9. A display device comprising:
   a substrate;
   a semiconductor layer on the substrate;
   a first insulating layer on the semiconductor layer;
   a gate electrode on the first insulating layer, the gate electrode overlapping the semiconductor layer;
   a second insulating layer on the gate electrode;
   an electrode structure on the second insulating layer, the electrode structure connected to the gate electrode through a via hole; and
   a source electrode and a drain electrode passing through the first insulating layer and the second insulating layer to be connected to the semiconductor layer,
   wherein the semiconductor layer comprises:
   a channel area overlapping the gate electrode;
   a source area connected to the source electrode;
   a drain area connected to the drain electrode;
   a lightly doped source (LDS) area between the source area and the channel area; and
   a lightly doped drain (LDD) area between the drain area and the channel area, and
   the electrode structure overlaps at least one of the lightly doped source (LDS) area or the lightly doped drain (LDD) area.

10. The display device as claimed in claim 9, wherein the electrode structure overlaps the lightly doped source area and the lightly doped drain area.

11. The display device as claimed in claim 9, wherein the gate electrode does not overlap the lightly doped source area and the lightly doped drain area.

12. The display device as claimed in claim 9, wherein the lightly doped source area and the lightly doped drain area are doped with an n-type impurity at a lower concentration than concentrations at which the source area and the drain area are doped with an n-type impurity.

13. The display device as claimed in claim 12, wherein the n-type impurity comprises at least one selected from a group comprising phosphorus (P) and arsenic (As).

14. The display device as claimed in claim 9, wherein the gate electrode and the electrode structure are applied with substantially a same voltage.

15. The display device as claimed in claim 9, wherein the channel area is doped with an n-type impurity at a lower concentration than concentrations at which the lightly doped source area and the lightly doped drain area are doped with an n-type impurity.

* * * * *